US006020595A

United States Patent [19]

Itoh et al.

[11] Patent Number: 6,020,595

[45] Date of Patent: Feb. 1, 2000

[54] COLD ELECTRON EMISSION DEVICE

[75] Inventors: Junji Itoh; Seigo Kanemaru, both of Tsukuba, Japan

[73] Assignee: Director-General of Agency of Industrial Science and Technology, Japan

[21] Appl. No.: 09/037,423

[22] Filed: Mar. 10, 1998

[30] Foreign Application Priority Data

Mar. 11, 1997 [JP] Japan .................................... 9-055671

[51] Int. Cl.[7] ...................................................... H01L 29/06

[52] U.S. Cl. ............................ 257/10; 313/309; 313/336; 313/351

[58] Field of Search .................................... 313/309, 336, 313/351, 308, 306; 257/10, 9, 72

[56] References Cited

U.S. PATENT DOCUMENTS

| | | | |
|---|---|---|---|
| 4,891,093 | 1/1990 | Smith | 156/613 |
| 5,268,648 | 12/1993 | Calcatera | 313/309 |
| 5,359,256 | 10/1994 | Gray . | |
| 5,479,256 | 12/1995 | Tamai et al. . | |
| 5,688,707 | 11/1997 | Lee et al. | 437/51 |

FOREIGN PATENT DOCUMENTS

| | | |
|---|---|---|
| 09063466 | 3/1997 | Japan . |

OTHER PUBLICATIONS

"Fabrication and Characteristics of Si Field Emitter Arrays", Keiichi Betsui, Technical Digest of IVMC 91, Nagahama 1991, pp. 26–29.

"Field–Effect Controlled Vacuum Field–Emission Cathodes", A. Ting, et al., Technical Digest of IVMC 91, Nagahama 1991, pp. 200–201.

"Active Control of Emission Current of Field Emitter Array", K. Yokoo, et al., Revue "Le Vide, les Couches Minces"–Supplément au N 271–Mars–Avril 1994 pp. 58–61.

"Monolithic Fabrication and Electrical Characteristics of Polycrystalline Silicon Field Emitters andThin Film Transistor", Gen Hashiguchi, et al., Jpn. J. Appl. Phys. vol. 35 (1996), pp. L84–L86, Part 2, No. 1B, Jan. 15, 1998.

"Active Control of the Emission Current of Field Emitter Arrays", Kuniyoshi Yokoo, et al., J. Vac. Sci. Technology B 13(2), Mar./ Apr. 1995 American Vacuum Society, pp. 491–493.

J.C. Loulergue et al., "E–Symmetry Phonon Polaritons in PbTiO3" 1995 The American Physical Society, Physical Review B, vol. 52, No. 21, Dec. 1995, p. 15 160–164.

H.J. Bakker et al., "Investigation of Anharmonic Lattice Vibrations with Coherent Phonon Polaritons" 1994 The American Physical Society, Physical Review B, vol. 50, No. 2, Jul. 1994, pp. 920.

H.J. Bakker et al., "Time–Resolved Study of Phonon Polaritons in LiTaO3" 1993 The American Physical Society, vol. 48, No. 18, Nov. 1993, pp. 13 524–13 537.

*Primary Examiner*—Jerome Jackson, Jr.
*Assistant Examiner*—Bradley William Baumeister
*Attorney, Agent, or Firm*—Fleshner & Kim

[57] ABSTRACT

A cold electron emission device including an emitter having a protrusion having a sharp tip and disposed at a first end of a semiconductor thin film formed on an insulation substrate; a cathode electrode disposed at a second end of the semiconductor thin film; at least one gate electrode disposed between the emitter and the cathode electrode for controlling a current flowing through the semiconductor thin film; an insulating layer arranged to cover the semiconductor thin film, cathode electrode and gate electrode, except for the emitter; and a lead electrode arranged on the insulating layer such that it surrounds the tip of the emitter, thereby making it possible to achieve a cold electron emission device with reliable current stability.

20 Claims, 6 Drawing Sheets

COLD ELECTRON EMISSION DEVICE

This application is based on Patent Application No. 055,671/1997 filed Mar. 11, 1997 in Japan, the content of which is incorporated hereinto by reference.

BACKGROUND OF THE INVENTION

1. Field of the Invention

The present invention relates to a field emission type cold electron emission device that emits electrons under a large external electric field. Such a cold electron emission device is widely applicable to ultrafast, highly environmental resistant electronic devices, various sensors, image display units like flat-panel displays, electron microscopes and various instruments using an electron beam.

2. Description of Related Art

FIG. 4 shows a typical cold electron emission device with an emitter consisting of a semiconductor (K. Betsui, Technical Digest 4th Int. Vacuum Microelectronics Conference, Nagahama, 1991, p. 26). The device comprises an emitter 2 with a sharp tip formed on an n- or p-type single crystal silicon substrate 1, an insulating layer 3 and a lead electrode 4 formed on the insulating layer 3 in such a manner that it surrounds the tip of the emitter 2. The emitter 2 is formed by a sharpening technique using plasma etching in conjunction with thermal oxidation. This type is the mainstream of the cold electron emission device at present because it has highly reproducible structure and provides a large emission current at a rather low voltage owing to the sharp tip of the emitter 2.

The field emission type cold electron emission device, however, has a problem of large fluctuations in its emission current which sharply reduces and increases according to the lapse of time, thereby breaking the device in the worst case. This also applies to the device as shown in FIG. 4, which hinders the practical use of the device. This phenomenon is mainly due to the fact that the work function of the emitter tip greatly fluctuates in space and time because of the adsorption of residual gas in the ambient and contamination in the fabrication process. The foregoing conventional example, however, does not devise any countermeasures against such fluctuations in the current.

In order to solve such a problem of the cold electron emission device, two strategies can be employed: one of them is to stabilize the work function of the emitter tip; and the other is to control the emission current. With regard to the emission current control, remarkable techniques have been proposed recently (A. Ting, et al., Technical Digest 4th Int. Vacuum Microelectronics Conference, Nagahama, 1991, p. 200; and K. Yokoo, et al., Technical Digest 7th Int. Vacuum Microelectronics Conference, Grenoble, France, 1994, p. 58).

FIG. 5 shows a device of this type. In FIG. 5, the magnitude of the current emitted from the tip of an emitter 12 is controlled by a field effect transistor (FET) connected in series with the emitter 12 having the same structure as the emitter 2 in FIG. 4. As shown in FIG. 5, the emitter 12 is provided on a p-type silicon substrate 11. The emitter 12 is an n-type, and its extended portion forms an n-type drain 13 of the FET. An n-type source 14 is arranged on the p-type substrate 11, and a source electrode 15 is provided on the source 14. Part of an insulating layer 17 between the substrate 11 and a lead electrode 16 is thinned to form a gate insulating layer 18, on which a gate electrode 19 is arranged. In this device, the gate voltage of the FET uniquely determines the drain current of the FET, which is equal to the emission current from the emitter tip. This means that the gate voltage also uniquely controls the emission current.

The FET controlled type cold electron emission device can solve in principle the problem involved in the conventional cold electron emission device because it can precisely control its current.

The conventional technique, however, must have the FET for controlling the current in addition to the emitter 12. In this case, the FET will generally occupy a larger area than the emitter 12 on a horizontal plane, even though it is formed around the emitter tip, that is, around the base of the protrusion. This will greatly increase the area per element, resulting in a remarkable reduction in the integration density of the emitters. The MOSFET in the element as shown in FIG. 5 must have a very long narrow gate because the current emitted from the single emitter 12 is very small on the order of less than one microampere. For example, to implement the drain current Id less than one microampere, it is necessary for the gate whose width is W and length L to satisfy the relation of L>100W considering that the drain current Id is proportional to W/L. This means that when W is 1–2 microns, L must be 100–200 microns, and that an area of several tens of square microns is required for each emitter. Furthermore, additional wiring to the source and gate electrode of the FET will further reduce the integration density of the emitters. Moreover, the FET, which must be formed separately from the emitter substantially complicates the fabrication process, thereby reducing manufacturing yield.

In order to solve the problems of the foregoing two conventional techniques, the inventors of the present application propose a device disclosed in Japanese Patent Application Laid-open No. 9-63466 (1997) laid-opened on Mar. 7, 1997. FIG. 6 shows the structure of the device. The device has its emitter protrusion 24 provided on one of two n-type regions 22 and 23 which are arranged on a p-substrate 21, a source electrode 25 arranged on the other of them, and an electrode 26 with an opening surrounding the emitter protrusion 24 arranged on an insulating layer 27 which is arranged across the two n-type regions 22 and 23. The device, when considering the emitter as a drain, has a well-known MOSFET structure, and hence the electrode 26 has the function of the gate electrode for controlling the channel current of the MOSFET, in addition to the function of the lead electrode that induces the field emission by generating a large electric field at the tip of the emitter protrusion 24. In this case, the field emission current increases on an exponential curve of the voltage applied to the electrode 26, whereas the channel current increases on a square curve thereof. Accordingly, supplying the electrode 26 with a rather high voltage enables the field emission current to be controlled to become greater than the channel current. Thus, the field emission current is limited by the channel current, which makes it possible to emit a constant current from the emitter tip as in the conventional example as shown in FIG. 5.

As described above, it is difficult for the conventional technique as shown in FIG. 4 to be put into practical use because its emission current is very unstable. Although the conventional technique as shown in FIG. 5 can achieve a stable current, its integration density of the emitters substantially reduces, and the number of its fabrication steps increases owing to the complicated fabrication process, thereby reducing its yield and increasing its cost. Although the conventional technique as shown in FIG. 6 is sophisticated in that its structure is simple and has a current stabilizing function, it has a drawback that it must have n-type impurities introduced into both the source and drain (emitter itself) regions. Generally speaking, it is not easy to introduce impurities evenly into a structure like the emitter with a sharp tip, which results in an increase in the cost. This causes a serious problem in application devices such as a flat-panel display.

SUMMARY OF THE INVENTION

It is therefore an object of the present invention to provide a cold electron emission device which can eliminate the foregoing problems involved in the conventional techniques with a simple structure and superior current stabilization.

There is provided a field emission type cold electron emission device comprising:

an emitter having a protrusion disposed at a first end of a semiconductor thin film arranged on an insulation substrate, the protrusion having a sharp tip;

a cathode electrode disposed at a second end of the semiconductor thin film;

at least one gate electrode disposed between the emitter and the cathode electrode for controlling a current flowing through the semiconductor thin film;

an insulating layer arranged to cover the semiconductor thin film, the cathode electrode and the gate electrode, except for the emitter; and a lead electrode arranged on the insulating layer such that it surrounds the tip of the emitter.

The above-described semiconductor structure does not require any p-n junction.

Here, the semiconductor thin film may be composed of a material selected from a group consisting of amorphous silicon, polysilicon, single crystal silicon and gallium arsenide.

The cold electron emission device may further comprise an insulating layer arranged between the gate electrode and the semiconductor thin film.

According to the present invention, the emitter is formed at the first end of the semiconductor thin film formed on the insulation substrate, the cathode electrode is provided at the second end thereof, and the gate electrode is provided between them, in which the current supplied from the cathode electrode to the emitter, that is, the emission current is controlled by generating a depletion region in the semiconductor thin film by applying a positive or negative voltage to the gate electrode to control the conductivity of the semiconductor thin film. The semiconductor thin film may be either a p-type or n-type, and it is not necessary to implant any impurities at any locations. In other words, there is no need to form a p-n junction which was required in the conventional technique as shown in FIG. 6. It is sufficient for the present device to have a semiconductor thin film, which will simplify the fabrication process and reduce the cost substantially, although the control mechanism of the emission current from the emitter is the same as that of the conventional technique as shown in FIG. 6.

The above and other objects, effects, features and advantages of the present invention will become more apparent from the following description of the embodiments thereof taken in conjunction with the accompanying drawings.

DETAILED DESCRIPTION OF PREFERRED EMBODIMENTS

The present invention will now be described with reference to the accompanying drawings.

Embodiment 1

Figure 1:
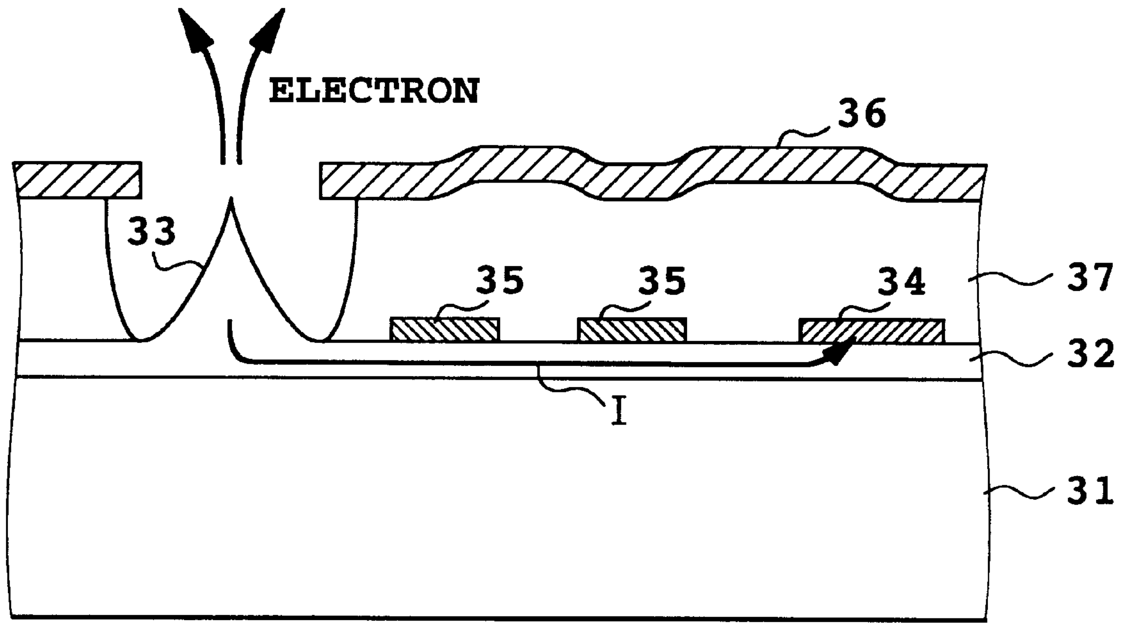
FIG. 1 is a cross-sectional view showing a first embodiment of a cold electron emission device in accordance with the present invention.

FIG. 1 shows a first embodiment in accordance with the present invention. The present embodiment comprises an insulation substrate 31 composed of glass, on which a semiconductor thin film 32 of a given conductivity type is provided. On the semiconductor thin film 32, an emitter 33 and a cathode electrode 34 are provided at both ends. The semiconductor thin film 32 is composed of a material selected from a group consisting of amorphous silicon, polysilicon, single crystal silicon and gallium arsenide. The emitter 33 can be formed by processing the semiconductor thin film 32 which has been formed thick, or by depositing it on the semiconductor thin film 32 which has been formed in advance. In the latter case, forming the emitter 33 and cathode electrode 34 can be formed by the same material, so that this formation makes the process simpler. To sharpen the tip of the emitter 33, a method disclosed in the foregoing Japanese Patent Application No. 9-63466 (1997) can be applied. The cathode electrode 34 is composed of 0.2–0.3 micron thick aluminum or polysilicon, and has an ohmic contact with the semiconductor thin film 32.

In the present embodiment, two Schottky-junction gate electrodes 35 are formed between the emitter 33 and the cathode electrode 34. The gate electrodes 35 are composed of chromium, for example. A lead electrode 36 with an opening surrounding the tip of the emitter 33 is arranged on an insulating layer 37 which is arranged on the semiconductor thin film 32, cathode electrode 34 and gate electrodes 35. The lead electrode 36 is composed of 0.2–0.3 micron thick niobium or polysilicon.

The cathode electrode 34, gate electrodes 35, insulating layer 37 and lead electrode 36 are formed through steps taken in the conventional fabrication process of a semiconductor device. The distance between the lead electrode 36 and the emitter 33 is about 0.5 micron in general.

The application of a voltage of 80 V to the lead electrode 36, for example, will induce a large field greater than $10^7$ V/cm at the tip of the emitter 33, thereby emitting electrons from the tip to the vacuum by means of the field emission phenomenon. The entire emission current is supplied from the cathode electrode 34 through the semiconductor thin film 32. When the semiconductor thin film 32 is an n-type, the application of a negative voltage to the gate electrodes 35 will increase the depletion layer in the semiconductor thin film 32, which in turn reduces the current I flowing through the emitter 33, thereby limiting the current emitted from the tip of the emitter 33. This means that an actual emission current is less than the field emission current originally determined by the voltage applied to the lead electrode 36. In this case, the current emission from the tip of the emitter 33 can be halted by increasing the gate voltage in the negative direction to such a level that the semiconductor thin film 32 is completely depleted and the current flow is stopped. Thus, the emission current from the emitter 33 can be regulated readily by controlling the gate voltage.

The current flows to the emitter 33 only when a positive or zero voltage is applied to both the gate electrodes 35, thereby emitting electrons. Accordingly, an x-y matrix can be arranged by associating the two gate electrodes 35 to an X address and Y address, respectively, which is convenient for applying it to a display or the like. A single gate electrode 35 is enough for controlling only the emission current from the emitter 33.

Since the device as shown in FIG. 1 employs a so-called depletion type current control method, the current can be controlled independently of the dimension of the gate. Thus, the length L and width W of the gate can be set at 1–2 microns. This means that the area per emitter can be reduced to less than 10 square microns even when the two gates are formed in series as shown in FIG. 1, which enables the emitter integration density to be significantly improved as compared with that of the conventional examples.

The device as shown in FIG. 1 can regulate the emission current from the emitter 33 equal to or less than one microampere, when setting the voltage applied to the lead electrode 36 at 80 V, and varying the voltage of the gate electrodes 35 in the range of −5~0 V. In particular, the emission current can be made zero by setting the gate voltage at −5 V.

The present invention can implement an inexpensive, low consumed power drive circuit when applied to a display because it is possible for the gate voltage equal to or less than 10 V to turn the current on and off by setting the thickness of the semiconductor thin film 32 at 100 nanometers or less. Thus, the structure as shown in FIG. 1 enables the emission current from the emitter 33 to be controlled accurately by merely forming a simple semiconductor film without forming a p-n junction by the local implantation of impurities.

When the semiconductor thin film 32 is the p-type, the application of a positive voltage to the gate electrodes 35 results in operation and effect similar to those of the foregoing n-type case. Generally speaking, the Schottky junction with the p-type semiconductor thin film 32 can be produced by forming a junction with a metal whose work function is less than that of the semiconductor thin film 32, whereas one with the n-type semiconductor thin film 32 can be produced by forming a junction with a metal whose work function is greater than the semiconductor thin film 32. The junction can be formed by a known process, and hence it is not necessary to limit such a process here.

Embodiment 2

Figure 2:
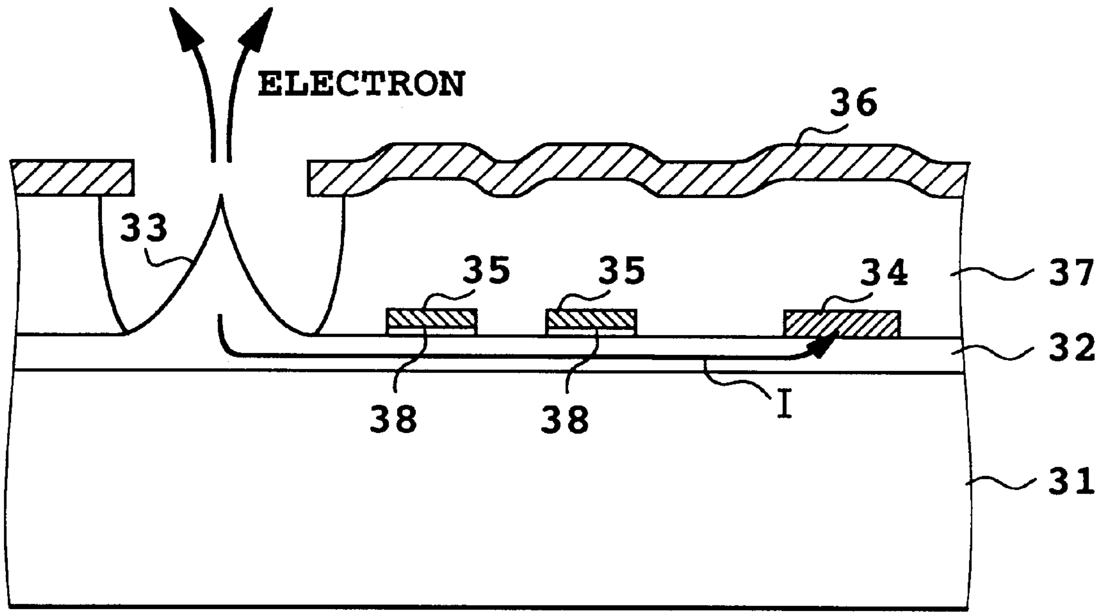
FIG. 2 is a cross-sectional view showing a second embodiment of the cold electron emission device in accordance with the present invention.

FIG. 2 shows a second embodiment in accordance with the present invention. The structure of the present embodiment is the same as that of the first embodiment as shown in FIG. 1 except that an insulating layer 38 is formed between the gate electrodes 35 and the semiconductor thin film 32. This makes it possible to eliminate the Schottky junction between the gate electrodes 35 and the semiconductor thin film 32, and to control the supply current to the emitter 33 independently of the material of the gate electrodes 35.

Embodiment 3

Figure 3:
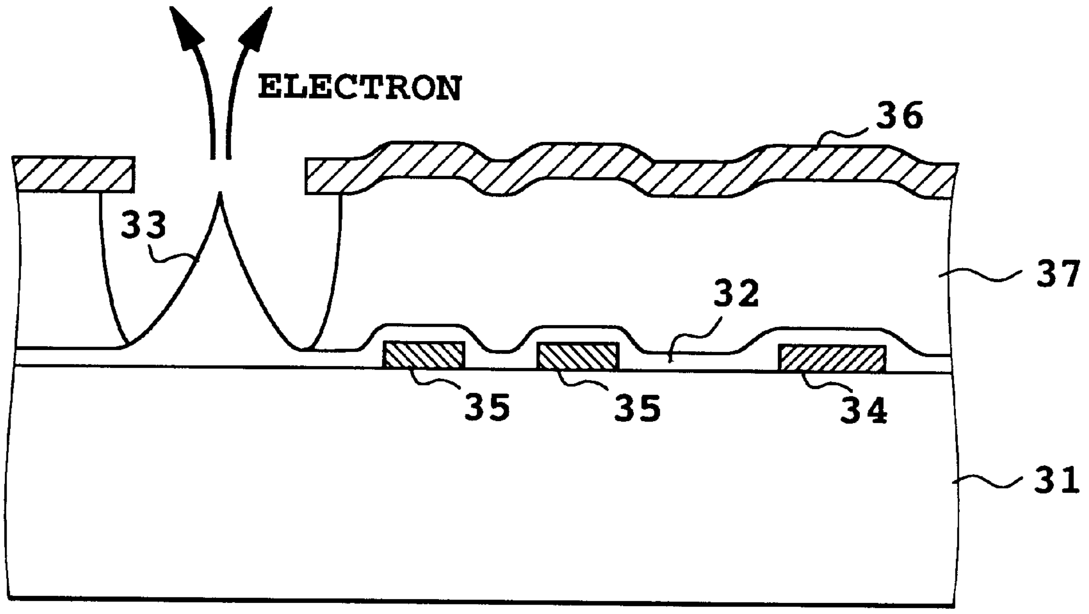
FIG. 3 is a cross-sectional view showing a third embodiment of the cold electron emission device in accordance with the present invention.
Figure 4:
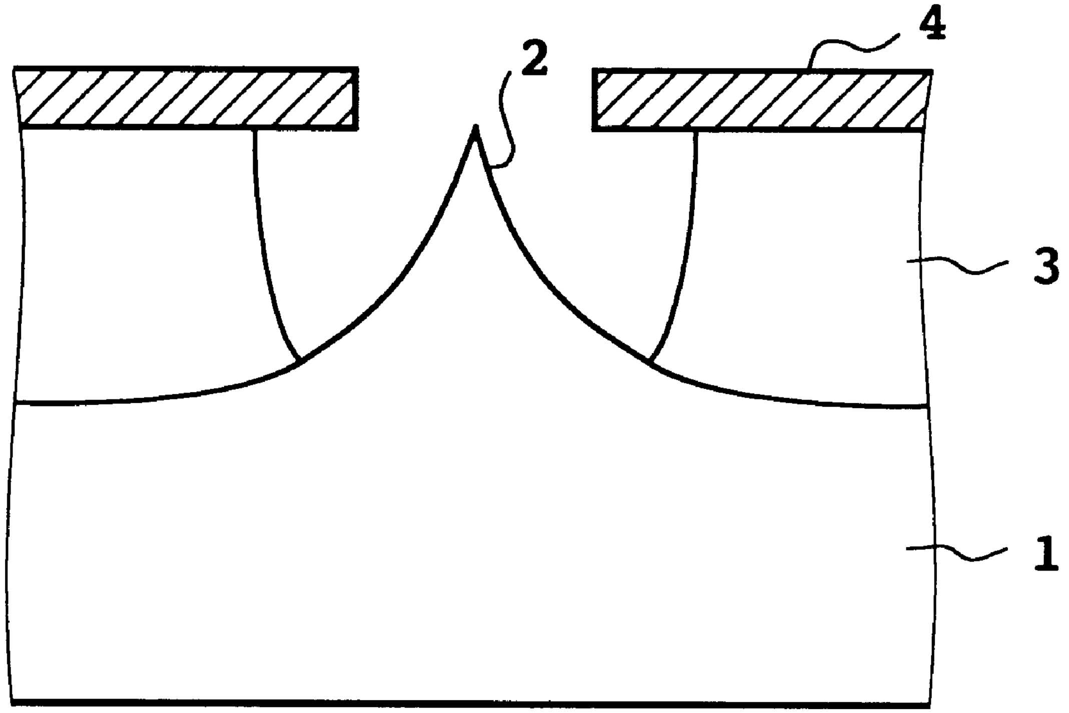
FIG.4 (PRIOR ART)
FIG. 4 is a cross-sectional view showing a conventional cold electron emission device.
Figure 5:
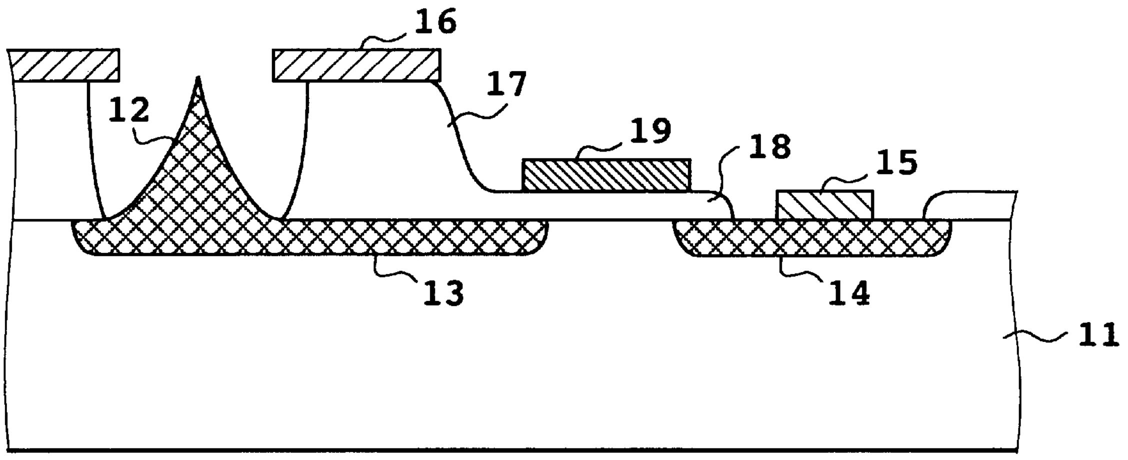
FIG.5 (PRIOR ART)
FIG. 5 is a cross-sectional view showing another conventional cold electron emission device.
Figure 6:
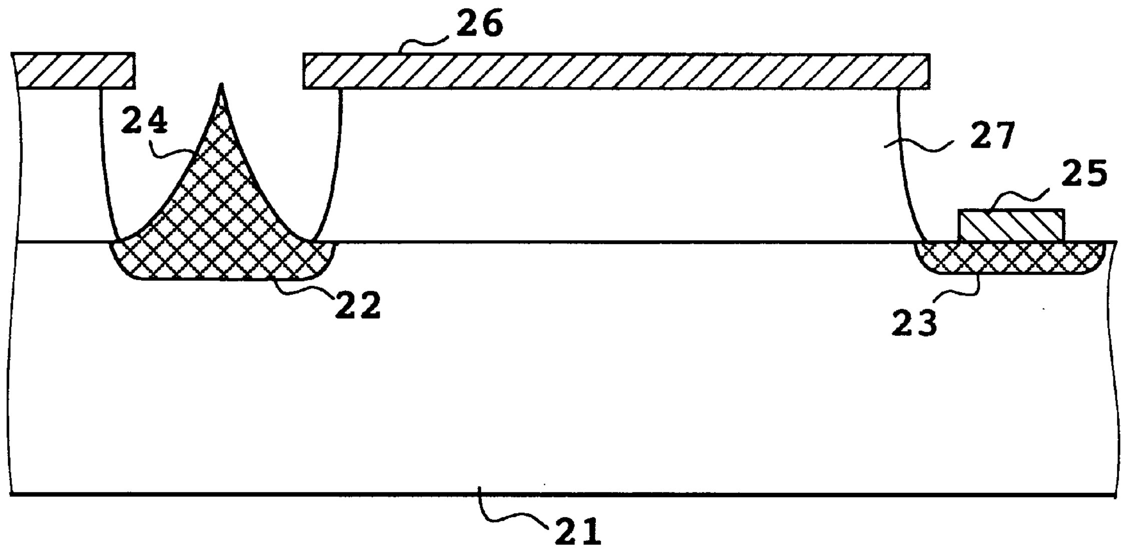
FIG.6 (PRIOR ART)
FIG. 6 is a cross-sectional view showing still another conventional cold electron emission device.

FIG. 3 shows a third embodiment in accordance with the present invention. The present embodiment 3 differs from the first embodiment as shown in FIG. 1 in that it has its gate electrode 35 and cathode electrode 34 formed directly on the insulation substrate 31, and its semiconductor thin film 32 is formed on them. The remaining structure is the same as that of FIG. 1. This provides an advantage besides those of the first embodiment that it can be fabricated easier than the device as shown in FIG. 1 because the semiconductor thin film 32 and the insulating layer 37 are formed successively after forming metal wiring on the glass substrate 31.

As described above, according to the present invention, a cold electron emission device can be implemented with a simple structure, good controllability of the emission current and high emitter integration density.

The present invention has been described in detail with respect to various embodiments, and it will now be apparent from the foregoing to those skilled in the art that changes and modifications may be made without departing from the present invention in its broader aspects, and it is the intention, therefore, in the appended claims to cover all such changes and modifications as fall within the true spirit of the present invention.

What is claimed is:

1. A field emission type cold electron emission device comprising:

an emitter having a protrusion disposed at a first end of a semiconductor thin film arranged on an insulation substrate, said protrusion having a sharp tip;

a cathode electrode disposed at a second end of said semiconductor then film;

a plurality of gate electrodes disposed between said emitter and said cathode electrode for controlling a current flowing through said semiconductor thin film;

an insulating layer arranged to cover said semiconductor thin film, said cathode electrode and said gate electrodes, except for said emitter; and a lead electrode arranged over said insulating layer such that it surrounds the tip of said emitter.

2. The cold electron emission device as claimed in claim 1, wherein said semiconductor thin film is composed of a material selected from a group consisting of amorphous silicon, polysilicon, single crystal silicon and gallium arsenide.

3. The cold electron emission device as claimed in claim 1, wherein said emitter is composed of the same material as said semiconductor thin film.

4. The cold electron emission device as claimed in claim 2, wherein said emitter is composed of the same material as said semiconductor thin film.

5. The cold electron emission device as claimed in claim 1, further comprising another insulating layer arranged between said gate electrodes and said semiconductor thin film.

6. The cold electron emission device as claimed in claim 3, further comprising another insulating layer arranged between said gate electrodes and said semiconductor thin film.

7. The cold electron emission device as claimed in claim 4, further comprising another insulating layer arranged between said gate electrode and said semiconductor thin film.

8. The cold electron emission device as claimed in claim 1, wherein the gate electrodes and cathode electrode are formed on the insulating substrate.

9. The cold electron emission device as claimed in claim 1, wherein the lead electrode includes niobium or polysilicon having a thickness of 0.2 to 0.3 microns.

10. The cold electron emission device as claimed in claim 1, wherein the lead electrode is located a distance of about 0.5 microns from the emitter.

11. The cold electron emission device as claimed in claim 1, wherein a current flows to the emitter when a non-negative voltage is applied to each of the gate electrodes.

12. The cold electron emission device as claimed in claim 11, wherein the application of a negative voltage to the gate electrodes reduces the current flowing through the emitter.

13. The cold electron emission device as claimed in claim 12, wherein the current flowing through the emitter is altered by increasing the negative voltage to the gate electrodes to a predetermined level.

14. The cold electron emission device as claimed in claim 1, wherein the semiconductor thin film is P+ or N+ type.

15. The cold electron emission device as claimed in claim 1, wherein the gate electrodes include chromium.

16. A field emission type cold electron emission device comprising:

emission means for emitting electrons under a large external electric field, the emission means having a protrusion disposed at a first end of a semiconductor thin film arranged on an insulation substrate, the protrusion having a sharp tip;

a cathode electrode disposed at a second end of the semiconductor thin film;

gate means for controlling a current flowing through a semiconductor thin film, the gate means including a plurality of gate electrodes disposed between the emitter means and the cathode electrode;

insulating means for covering the semiconductor thin film, the cathode electrode and the gate means; and lead means for surrounding the tip of the emission means, the lead means including a lead electrode formed over the insulating means.

17. The cold electron emission device as claimed in claim 16, wherein the insulating means further includes another insulating layer arranged between the gate means and the semiconductor thin film.

18. The cold electron emission device as claimed in claim 16, wherein a current flows to the emission means when a non-negative voltage is applied to the gate means.

19. The cold electron emission device as claimed in claim 18, wherein the application of a negative voltage to the gate means reduces the current flowing through the emission means.

20. The cold electron emission device as claimed in claim 19, wherein the current flowing through the emission means is altered by increasing the negative voltage to the gate means to a predetermined level.

* * * * *